United States Patent
Tu et al.

(10) Patent No.: US 8,216,901 B2
(45) Date of Patent: Jul. 10, 2012

(54) FABRICATION METHOD OF TRENCHED METAL-OXIDE-SEMICONDUCTOR DEVICE

(75) Inventors: Kao-Way Tu, Jhonghe (TW); Yen-Chih Huang, Taipei (TW)

(73) Assignee: Nico Semiconductor Co., Ltd., Taipei (TW)

( * ) Notice: Subject to any disclaimer, the term of this patent is extended or adjusted under 35 U.S.C. 154(b) by 83 days.

(21) Appl. No.: 12/457,928

(22) Filed: Jun. 25, 2009

(65) Prior Publication Data

US 2010/0330760 A1    Dec. 30, 2010

(51) Int. Cl.
*H01L 21/336* (2006.01)
(52) U.S. Cl. .................. 438/270; 257/E21.41
(58) Field of Classification Search .......... 438/270, 438/589; 257/E21.41
See application file for complete search history.

(56) References Cited

U.S. PATENT DOCUMENTS

| | | | |
|---|---|---|---|
| 2006/0267088 A1* | 11/2006 | Sharp et al. | 257/341 |
| 2006/0289928 A1* | 12/2006 | Takaya et al. | 257/330 |
| 2008/0035989 A1* | 2/2008 | Jaw et al. | 257/330 |
| 2008/0199995 A1* | 8/2008 | Woolsey et al. | 438/259 |
| 2009/0014785 A1* | 1/2009 | Moens et al. | 257/330 |
| 2009/0218619 A1* | 9/2009 | Hebert et al. | 257/332 |

* cited by examiner

*Primary Examiner* — William D Coleman
*Assistant Examiner* — Christine Enad
(74) *Attorney, Agent, or Firm* — Rosenberg, Klein & Lee

(57) ABSTRACT

A fabrication method of trenched metal-oxide-semiconductor device is provided. A pattern layer with a plurality of openings is formed on a semiconductor base, and then a spacer is formed on the sidewall of the opening to define the gate trench. After the gate electrode formed in the gate trench, a dielectric structure is formed on the gate electrode by filling dielectric material into the opening. Then, the pattern layer and the spacer are removed and a dielectric layer is formed on the dielectric structure. The portion of the dielectric layer on the sidewall of the dielectric structure defines the source regions. After the source regions are formed in the well, another dielectric layer is formed on the dielectric layer to define the heavily doped regions adjacent to the source regions.

21 Claims, 6 Drawing Sheets ated by the aligning errors among the aligning steps regarding each of the masks. For example, if there is an aligning error e1, e2 ranged from 0 to 0.1 micron, a buffer of 0.1 micron should be taken into concerned when the width of the inter-layer dielectric layer 50 or the source region 40 is estimated. That is, the MOS device has to preserve at least 0.4 micron as the buffer for the aligning errors.

FABRICATION METHOD OF TRENCHED METAL-OXIDE-SEMICONDUCTOR DEVICE

BACKGROUND OF THE INVENTION

1. Field of the Invention

This invention relates to a fabrication method of a trenched metal-oxide-semiconductor (MOS) device, and more particularly relates to a fabrication method of a high cell-density trenched MOS device.

2. Description of Related Art

The MOS devices can be sorted into the planar ones and the vertical ones according to the direction of current flow. For the planar MOS device, the source electrode and the drain electrode are located on the same surface of the semiconductor base to result in a horizontal conduction current, whereas, for the vertical MOS device, the source electrode and the drain electrode are located on the opposite surfaces of the semiconductor base respectively to result in a vertical conduction current.

As to the planar MOS device, the withstanding voltage depends on the length of the channel between the source electrode and the drain electrode, which is substantially identical to the width of the gate electrode. However, for the vertical MOS device, the withstanding voltage depends mainly on the doping concentration of the semiconductor base. Therefore, the planar MOS device usually needs to occupy a greater area on the semiconductor base and the increasing of cell density is thus restricted. In addition, according to the arrangement of gate electrode, the vertical MOS device can be sorted into the planar one and the trenched one. Wherein, the trenched-gate MOS device has the gate electrode arranged in a trench formed in the semiconductor base, which reduces the surface area occupied by the gate electrode and is helpful for increasing cell density.

FIG. 1 is a schematic view of a typical trenched-gate MOS device. As shown, the trenched-gate MOS device is formed on a semiconductor base 10, which is composed of a semiconductor substrate 12 and an epitaxial layer 14. The gate electrode 20 is located in a trench formed in the epitaxial layer 14 and is isolated from the epitaxial layer 14 with a gate oxide layer 22. The well 30 is located by the gate electrode 20. The source region 40 is located in the well 30. The source metal layer 60 connects the source region 40 and electrically couples to the well 30 through a heavily doped region 32.

In order to electrically isolate the gate electrode 20 from the source metal layer 60, an inter-layer dielectric layer 50 is formed over the gate electrode 20. The inter-layer dielectric layer 50 also has a contact window to expose the well 30 and the source region 40 so as to allow the source metal layer 60 on the inter-layer dielectric layer 50 contact the well region 30 and the source region 40.

The fabrication process of such trenched-gate MOS device needs at least three masks to define the location of gate electrode 20, the source region 40, and the contact window of the inter-layer dielectric layer 50, respectively. The alignment of each of the masks induces aligning errors. To prevent the failure of the MOS devices, the portion of the inter-layer dielectric layer 50 located on the gate electrode 20 should be wider than the gate electrode 20 plus a predetermined buffer to make sure that the source metal layer 60 is isolated from the gate electrode 20. Meanwhile, the range of the source region 40 should be great enough to make sure that the source region 40 is able to connect the source metal layer 60 through the inter-layer dielectric layer 50.

Therefore, the size of the MOS device is restricted not only by the minimum line-width of the lithographic process but Accordingly, it is an important issue to overcome the restriction of minimum line-width and aligning errors of the present semiconductor fabrication technology to find out a method to reduce the size of the MOS device so as to increase cell density.

SUMMARY OF THE INVENTION

It is an object of the present invention to reduce the size of MOS device by using the present semiconductor fabrication technology so as to increase cell density. It is another object of the present invention to reduce the number of masks being used so as to lower down the fabrication cost.

According to an embodiment of the present invention, the present invention provides a fabrication method of a trenched MOS device, which comprises the steps of: (a) providing a semiconductor base; (b) forming a gate trench in the semiconductor base, and the gate trench extending from an upper surface of the semiconductor base downward; (c) forming a gate electrode in the gate trench; (d) forming a dielectric structure on the gate electrode, and the dielectric structure protruding the upper surface of the semiconductor base; (e) forming a well in an upper portion of the semiconductor base; (f) forming a source region in the well and adjacent to the gate electrode; (g) depositing a first dielectric layer over the semiconductor base as a whole; (h) forming a heavily doped region in the well by using the dielectric structure and the first dielectric layer on a sidewall of the dielectric structure as a ion implantation mask; (i) removing at least a portion of the first dielectric layer to expose the source region and the heavily doped region; and (j) forming a source metal layer connecting to the source region and the heavily doped region.

According to another embodiment, the present invention provides another fabrication method of the trenched MOS device, which comprises the steps of: (a) providing a semiconductor base; (b) forming a gate trench in the semiconductor base, and the gate trench extending from an upper surface of the semiconductor base downward; (c) forming a gate electrode in the gate trench; (d) forming a dielectric structure on the gate electrode, and the dielectric structure protruding from the semiconductor base; (e) forming a well at an upper portion of the semiconductor base; (f) forming a first doped region at an upper portion of the well; (g) depositing a first dielectric layer on the semiconductor base; (h) removing a portion of the first doped region by using the dielectric structure and the first dielectric layer on a sidewall of the dielectric structure as a mask to form a source region adjacent to the gate electrode and expose the well beneath the first doped region; (i) forming a heavily doped region in the well; (j) removing at least a portion of the first dielectric layer to expose the source region and the heavily doped region; and (k) forming a source metal layer connecting the source region and the heavily doped region.

In an embodiment of the present invention, the step of forming the gate trench in the semiconductor base comprises: (a) forming a pattern layer on the upper surface of the semiconductor base; (b) forming a first spacer on the sidewall of the opening of the pattern layer; and (c) etching the semiconductor base through the pattern layer and the first spacer to form the gate trench.

In an embodiment of the present invention, after the step of forming the gate trench, the fabrication method further comprises the steps of: (a) forming a second spacer covering at least the sidewall of the gate trench; and (b) etching the semiconductor base through the pattern layer, the first spacer, and the second spacer to form a groove beneath the gate trench.

In an embodiment, the step of forming the gate trench in the semiconductor base comprises: (a) forming a pattern layer on the upper surface of the semiconductor base; (b) forming a concave in the surface region of the semiconductor base; (c) forming a first spacer covering at least the sidewall of the concave; and (d) etching the semiconductor base through the pattern layer and the first spacer to form the gate trench beneath the concave, which is utilized for defining the dielectric structure.

The fabrication method provided in the embodiments of the present invention only needs one mask for defining the gate trench. The positions of the source region and the contact window between neighboring dielectric structures can be defined by using the dielectric layer covering the dielectric structure. Therefore, the masks needed for defining the source region and the contact window can be skipped and the fabrication cost can be reduced. Meanwhile, the influence of aligning error generated from the aligning steps regarding each of the masks can be prevented, which is helpful for increasing cell density. Therefore, by using the fabrication method of the present invention, the width of the gate trench is smaller that of the opening of the pattern layer by using the spacer on the sidewall of the opening of the pattern layer. As a result, size of the gate trench can be shrunk below minimum line-width of the lithographic process.

BRIEF DESCRIPTION OF THE DRAWINGS

The present invention will now be specified with reference to its preferred embodiment illustrated in the drawings, in which.

DETAILED DESCRIPTION OF THE PREFERRED EMBODIMENTS

The fabrication method provided in the present invention forms the spacer on the sidewall of the opening of the pattern layer to reduce the width of the gate trench and fills the opening of the pattern layer with dielectric material to form the dielectric structure self aligned to the gate electrode. In addition, the fabrication method in the present invention defines the range of source regions by depositing a dielectric layer over the original dielectric structure to increase the width of the dielectric structure above the gate electrode. Moreover, the fabrication method in the present invention defines a heavily doped region in the well by depositing a dielectric layer over the original dielectric structure to increase the width of the dielectric structure above the gate electrode.

Figure 1:
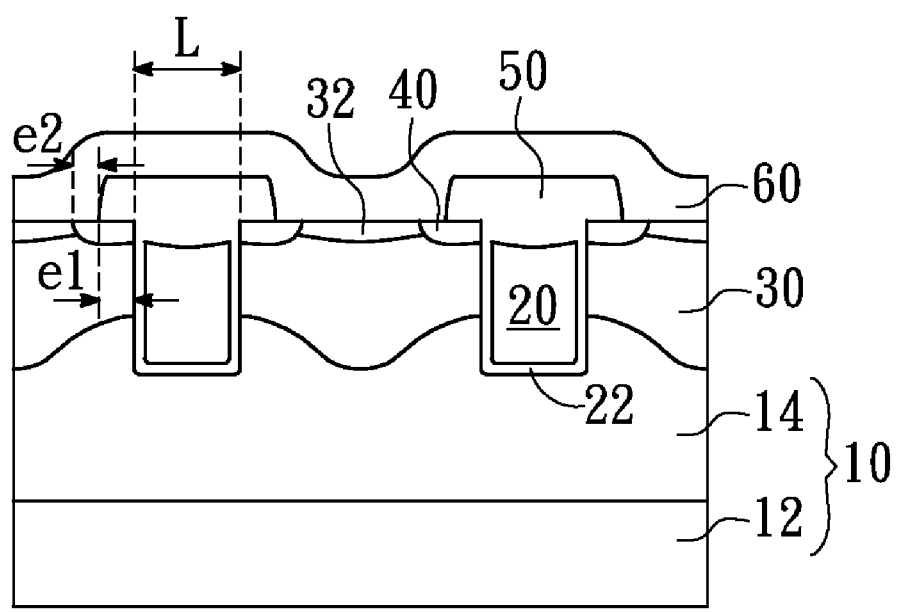
FIG. 1 is a schematic cross-section view of a typical trenched MOS device.
Figure 2A:
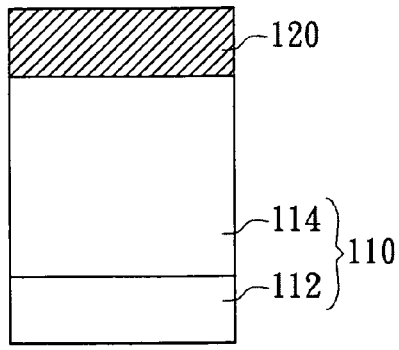
FIGS. 2A to 2L are schematic views showing the fabrication method of the trenched MOS device in accordance with a first embodiment of the present invention.
Figure 2B:
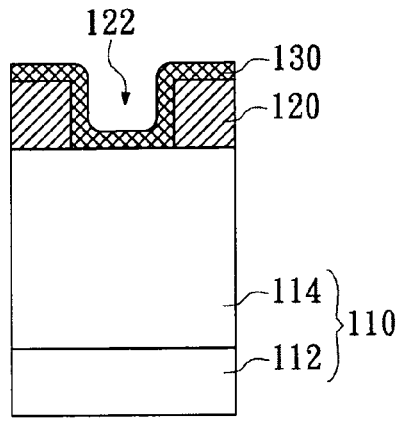

FIGS. 2A to 2L are schematic views showing the fabrication method of the trenched MOS device according to a first embodiment of the present invention. Firstly, as shown in FIG. 2A, a semiconductor base 110 including a substrate 112 and an epitaxial layer 114 formed on the substrate 112 is provided. Afterward, a pattern layer 120 is formed on the upper surface of the semiconductor base 110 and then a plurality of openings 122 is formed in the pattern layer 120 to define the position of the gate trench. The pattern layer may be a silicon nitride layer. Thereafter, as shown in FIG. 2B, a protecting layer 130 is deposited along the surface profile of the pattern layer 120. Then, a portion of the protecting layer 130 covering the upper surface of the pattern layer 120 and the bottom of the opening 122 is removed by using anisotropic etching process and a spacer 132 is formed on the sidewall of the opening 122. Afterward, an etching step is carried out by using the pattern layer 120 and the spacer 132 as a mask to form the gate trench 140 in the semiconductor base 110, which extends downward from the upper surface of the semiconductor base 110.

Figure 2C:
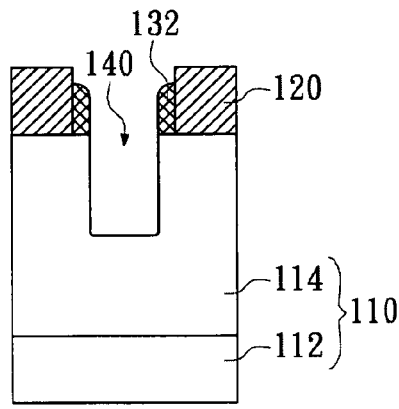
Figure 2D:
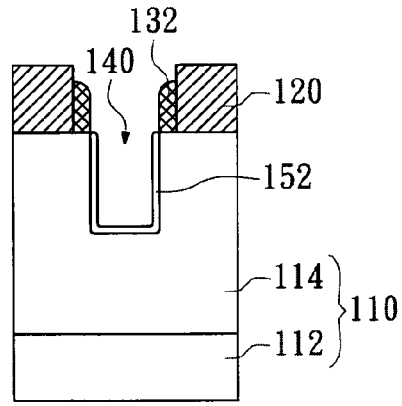
Figure 2E:
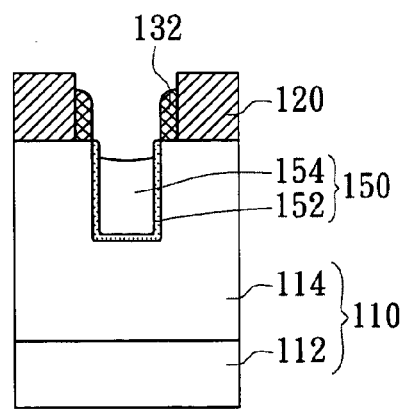
Figure 2F:
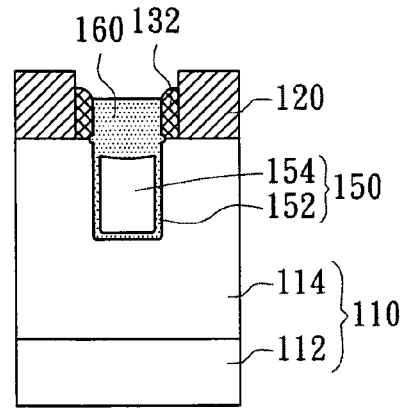

Afterward, as shown in FIGS. 2D and 2E, a gate oxide layer 152 is formed on the inner surface of the gate trench 140 and a polysilicon structure 154 is formed in the gate trench 140. The gate oxide layer 152 and the polysilicon structure 154 compose the gate electrode 150 of the MOS device. Thereafter, as shown in FIG. 2F, a dielectric structure 160 is formed on the gate electrode 150 by filling the opening 122 of the pattern layer 120 with dielectric material, such as silicon oxide. The dielectric structure 160 extends downward into the gate trench 140 and protrudes the upper surface of the semiconductor base 110. In the present fabrication step, because the sidewall of the opening 122 is covered by the spacer 132 and the dielectric structure 160 is formed in the space defined by the spacer 132, the width of the dielectric structure 160 on the gate electrode 150 is substantially identical to that of the gate trench 140.

Figure 2G:
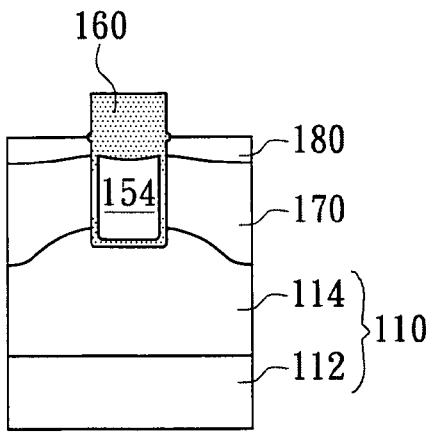

Afterward, as shown in FIG. 2G, the pattern layer 120 and the spacer 132 above the semiconductor base 110 are removed. Then, an ion implantation process is carried out to form a well 170 in the upper portion of the semiconductor base 110. The conductivity type of the well 170 is opposite to that of the epitaxial layer 114. Afterward, another ion implantation process is carried out to form a first doped region 180 of an opposite conductivity type in the upper portion of the well 170. The first doped region 180 is utilized for forming the source region of the MOS device.

Figure 2H:
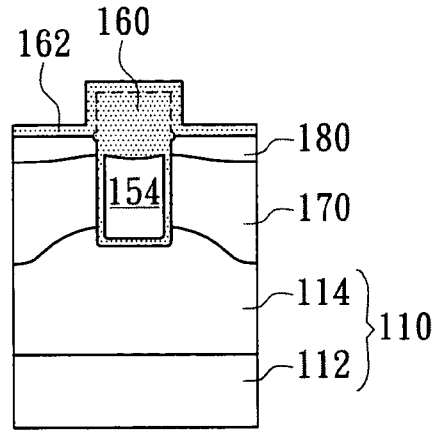
Figure 2I:
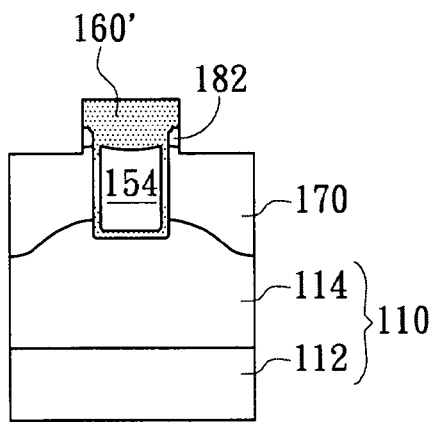

Then, as shown in FIG. 2H, a first dielectric layer 162 is deposited over the semiconductor base 110 and extended along the surface profile of the semiconductor base 110 and the dielectric structure 160. The first dielectric layer 162 may be a low temperature oxide (LTO) layer. Afterward, as shown in FIG. 2I, a portion of the first dielectric layer 162 is removed by etching to leave the portion on the sidewall of the dielectric structure 160. Meanwhile, the first doped region 180 below the first dielectric layer 162 is exposed. Then, the exposed first doped region 180 is etched by using the dielectric structure 160 and the remained first dielectric layer 162 as a mask to expose the well 170 below the first doped region 180 and form the source region 182 adjacent to the gate trench 140. The location of the source region 182 is corresponded to the first dielectric layer 162 on the sidewall of the dielectric structure 160 and the range of the source region 182 is decided the thickness of the first dielectric layer 162. As a preferred embodiment, a two step etching process may be used in the above mentioned etching steps. Firstly, an anisotropic etching step is carried out without using a mask to remove the portion of the first dielectric layer 162 right on the well 170 to expose the first doped region 180. The remained first dielectric layer 162 and the original dielectric structure 160 compose a dielectric structure 160' with a width greater than that of the original dielectric structure 160. Then, the exposed first doped region 180 is removed in the second etching step, which may be carried out by using selectively etching or anisotropic etching method, so as to expose the well 170 below the first doped region 180.

Figure 2J:
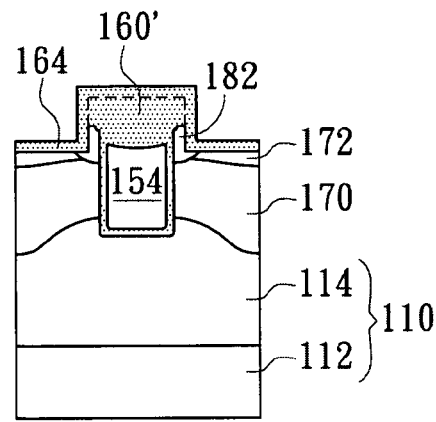

Then, as shown in FIG. 2J, a second dielectric layer 164 is deposited over the semiconductor base 110 and extended along the surface profile of the semiconductor base 110 and the dielectric structure 160'. The portion of the second dielectric layer 164 corresponding to the sidewall of the dielectric structure 160' defines the contact window between the well 170 and the source metal layer. The second dielectric layer 164 may be also a LTO layer. Afterward, an ion implantation process is carried out to form a heavily doped region 172 in the well 170 by using the dielectric structure 160' and the second dielectric layer 164 on the sidewall of the dielectric structure 160' as a mask. The heavily doped region 172 is adjacent to the source region 182 and has a conductivity type identical to that of the well 170.

Figure 2K:
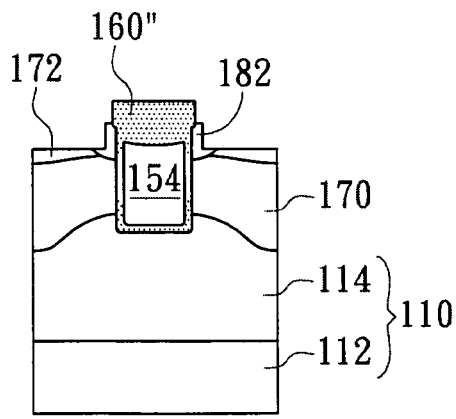
Figure 2L:
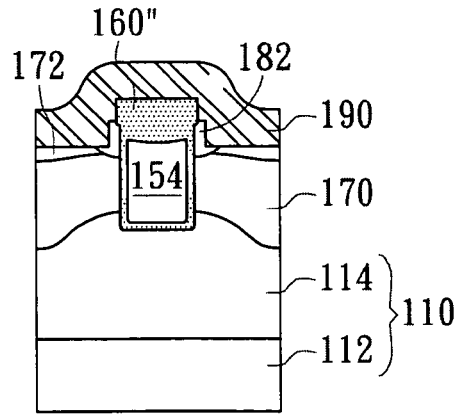

Afterward, as shown in FIG. 2K, the second dielectric layer 164 is etched with the portion thereof above the source region 182 and the heavily doped region 172 being removed to expose the source region 182 and the heavily doped region 172 and a dielectric structure 160" is formed above the gate trench 140. As a preferred embodiment, the width of the dielectric structure 160" should be smaller than that of the original dielectric structure 160' to make sure that the source region 182 is exposed for connecting the source metal layer. Then, as shown in FIG. 2L, a source metal layer 190 is formed over the semiconductor base 110 and the dielectric structure 160" to connect the source region 182 and the heavily doped region 172.

As mentioned, the fabrication method of the present embodiment only needs one mask to define the position of the gate trench. The position of the source region 182 and the contact window between dielectric structures 160' are defined by the first dielectric layer 162 and the second dielectric layer 164. Thus, the number of masks as well as the fabrication cost can be reduced. Meanwhile, the influence of aligning error, which comes from the mismatch of the aligning steps regarding each of the masks as described in prior art, can be prevented to increase cell density. Accordingly, the restriction of minimum line-width in the lithographic process can be overcome by using the spacer 132 lining the sidewall of the opening 122 of the pattern layer 120 to define the gate trench 140 with a width thereof smaller then that of the opening 122 of the pattern layer 120.

Figure 3A:
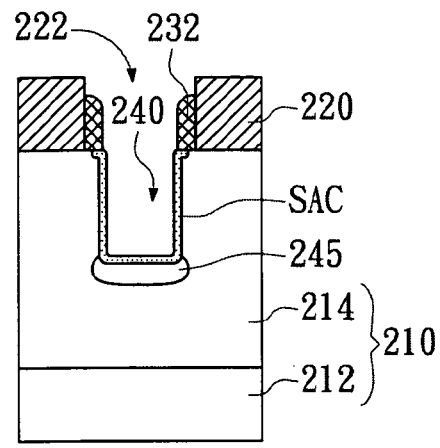
FIGS. 3A to 3E are schematic views showing the fabrication method of the trenched MOS device in accordance with a second embodiment of the present invention.
Figure 3B:
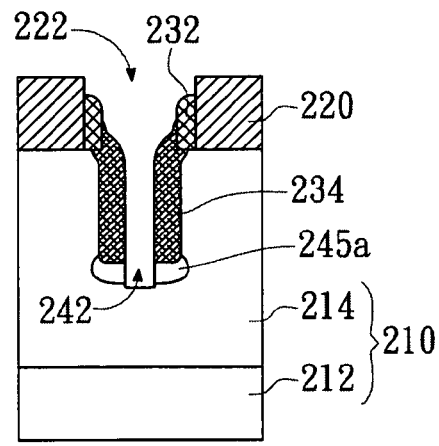
Figure 3C:
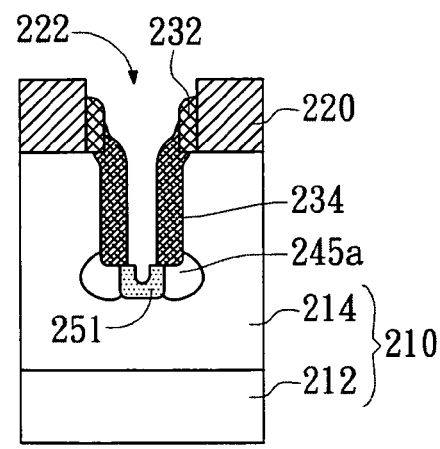
Figure 3D:
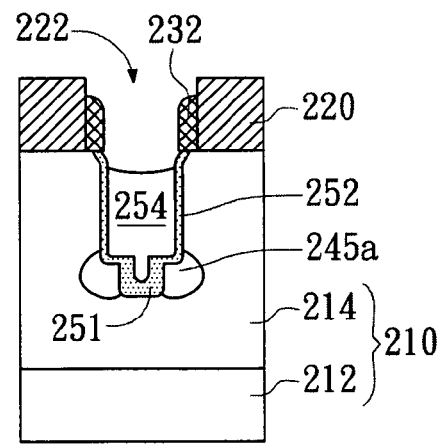
Figure 3E:
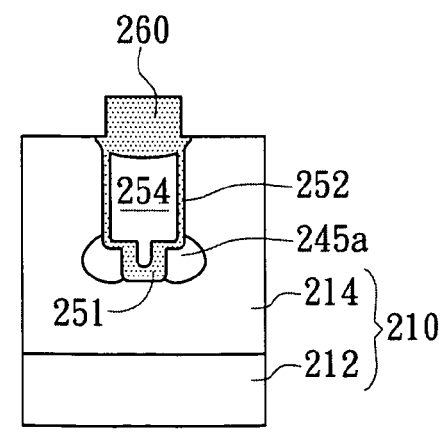

FIGS. 3A to 3E are schematic views showing the fabrication method of the trenched MOS device in accordance with a second embodiment of the present invention, wherein the fabrication step described in FIG. 3A follows the fabrication step of FIG. 2C in the first embodiment, and the fabrication steps after FIG. 3E is substantially identical to the fabrication steps after FIG. 2G in the first embodiment. For simplicity, only the difference between the present embodiment and the first embodiment is described below.

As shown in FIG. 3A, after the formation of the gate trench 240, a sacrifice oxide layer SAC is formed on the inner surface of the gate trench 240. Then, an ion implantation process is carried out to form a second doped region 245 at the bottom of the gate trench 240. The conductivity type of the second doped region 245 is identical to that of the epitaxial layer 214 but with a higher concentration. Thereafter, as shown in FIG. 3B, the sacrifice oxide layer SAC is removed and a spacer 234 is formed on the sidewall of the gate trench 240. The spacer 234 must cover at least the whole sidewall of the gate trench 240, and in the present embodiment, the spacer 234 further extend to the other spacer 232 in the opening 222 of the pattern layer 220. Then, an etching process is carried out by using the pattern layer 220 and the spacers 232, 234 as a mask to form a groove 242 in the semiconductor base 210 below the gate trench 240. The groove 242 penetrates the second doped region 245 to have the second doped region 245 separated into two portions 245a.

Thereafter, as shown in FIG. 3C, with the inner surface of the gate trench 240 being covered by the spacer 234, a thick dielectric layer 251 is formed in the groove 242, which is not covered by the spacer 234. The thick dielectric layer 251 may be formed by using wet oxidation, such as the method local oxidation of silicon (LOCOS). Afterward, as shown in FIG. 3D, the spacer 234 is removed and a gate dielectric layer 252 is formed on the inner surface of the gate trench 240. Then, a polysilicon structure 254 is formed in the gate trench 240 to complete the gate electrode. Thereafter, as shown in FIG. 3E, a dielectric structure 260 is formed above the polysilicon structure 254 by filling dielectric material into the opening 222 of the pattern layer 220, and then the pattern layer 220 and the spacer 232 are removed to expose the semiconductor base 210.

In contrast with the first embodiment, the fabrication method in the present embodiment has a thick dielectric layer 251 formed at the bottom of the gate electrode, which may reduce gate-to-drain capacitance Cgd and improve switching loss. Meanwhile, in the present embodiment, two heavily doped regions 245a are formed beside the groove 242 below the gate electrode. The heavily doped regions 245a are utilized to prevent over-expansion of well to shield the bottom of the gate trench to fail the device.

Figure 4A:
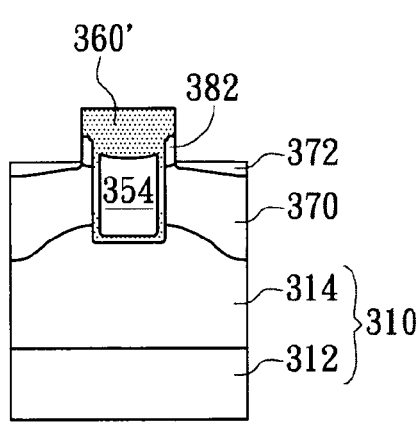
FIGS. 4A and 4B are schematic views showing the fabrication method of the trenched MOS device in accordance with a third embodiment of the present invention.
Figure 4B:
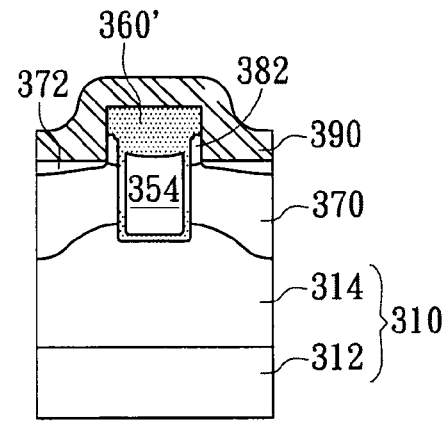

FIGS. 4A and 4B are schematic views showing the trenched MOS device in accordance with a third embodiment of the present invention, wherein the fabrication step of FIG. 4A follows the fabrication step of FIG. 2I in the first embodiment. For simplicity, only the difference between the present embodiment and the first embodiment is described below.

As shown in FIG. 4A, after the formation of the source region 382, an ion implantation process is carried out by using the dielectric structure 360' (corresponding to the dielectric structure 160' in FIG. 2I) as a mask so as to form a heavily doped region 372 in the upper portion of the well 370. Then, as shown in FIG. 4B, a source metal layer 390 is formed on the semiconductor base 310 and the dielectric structure 360' to connect the source region 382 and the heavily doped region 372. In contrast with the fabrication method of the first embodiment, the present embodiment uses the dielectric structure 360' to define the range of the source region 382 as well as the position of the heavily doped region 372 and skips the formation of the second dielectric layer 164 and the corresponding etching step.

Figure 5A:
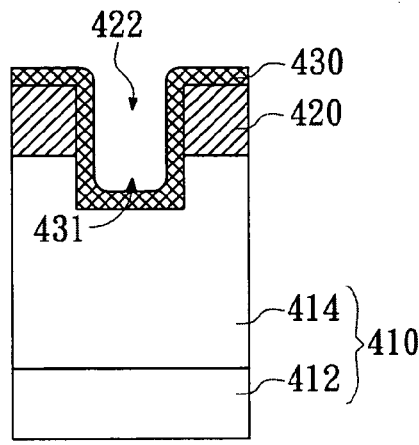
FIGS. 5A to 5I are schematic views showing the fabrication method of the trenched MOS device in accordance with a fourth embodiment of the present invention.

FIGS. 5A to 5I are schematic views showing the trenched MOS device in accordance with a fourth embodiment of the present invention. Firstly, as shown in FIG. 5A, a semiconductor base 410 including a substrate 412 and an epitaxial layer 414 located on the substrate 412 is provided. Then, a pattern layer 420 is formed on the upper surface of the semiconductor base 410. The pattern layer 420 has a plurality of openings 422 to define the location of gate trenches. Afterward, the exposed portion of the semiconductor base 410 is etched to form at least one concave 431 in the surface region thereof. Thereafter, a protection layer 430 is deposited along the surface profile of the pattern layer 420 and the semiconductor base 410.

Figure 5B:
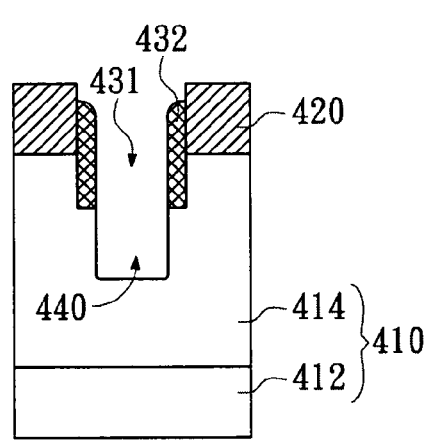

Afterward, as shown in FIG. 5B, an anisotropic etching step is carried out to remove the portion of the protection layer 430 located on the upper surface of the pattern layer 420 and at the bottom of the concave 431 to leave a spacer 432 at least covering the sidewall of the concave 431. Then, another etching step is carried out to form the gate trenches 440 in the semiconductor base 410 below the concave 431 by using the pattern layer 420 and the spacer 432 as a mask. It is noted that the concave 431 in the surface region of the semiconductor base 410 is utilized for defining the dielectric structure on the gate trench 440.

Figure 5C:
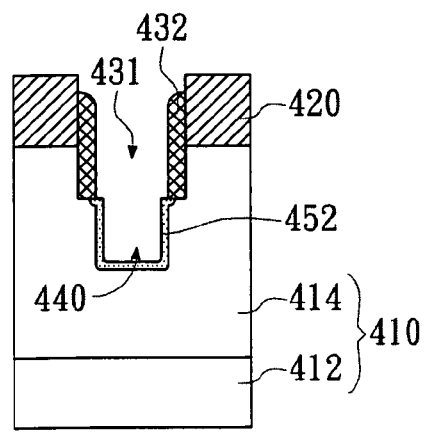
Figure 5D:
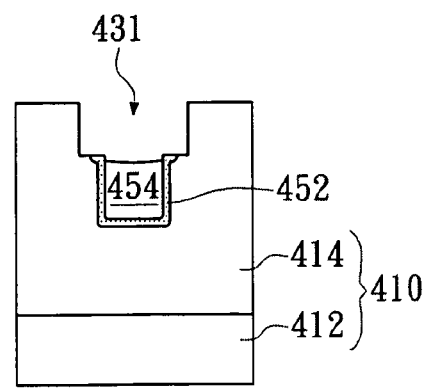

Afterward, as shown in FIG. 5C, a gate oxide layer 452 is formed on the inner surface of the gate trench 440. Then, as shown in FIG. 5D, a polysilicon structure 454 is formed in the gate trench 440. Thereafter, the pattern layer 420 and the spacer 432 are removed to expose the bottom surface of the concave 431 and the upper surface of the epitaxial layer 414.

Figure 5E:
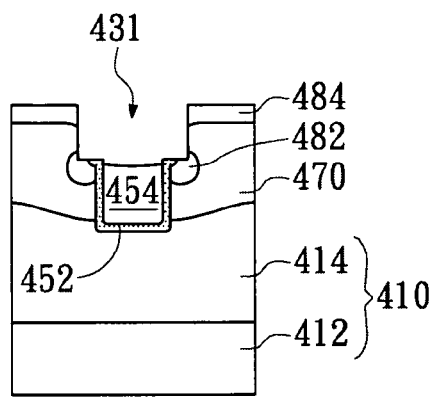

Afterward, as shown in FIG. 5E, an ion implantation step is carried out by implanting dopants into the epitaxial layer 414 to form a well 470 in the upper portion of the semiconductor base 410. The conductivity type of the well 470 is opposite to that of the epitaxial layer 414. Then, another ion implantation step is carried out to form the source regions 482 at the bottom of the concave 431 beside the gate electrode. The conductivity type of the source region 482 is opposite to that of the well 470. Since the upper surface of the epitaxial layer 414 is exposed, another doped region 484 is also formed close to the upper surface of the semiconductor base 410 in the present ion implantation step.

Figure 5F:
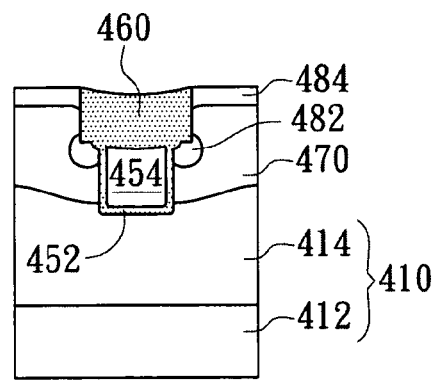
Figure 5G:
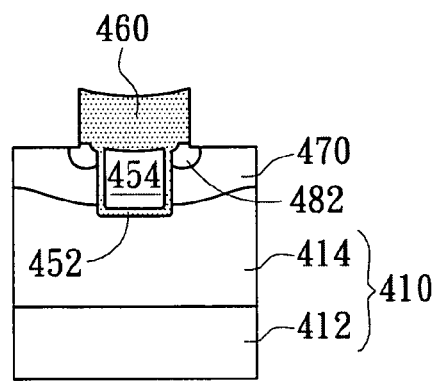

Afterward, as shown in FIG. 5F, a dielectric structure 460 is formed above the polysilicon structure by filling dielectric material such as silicon oxide into the concave 431. The width of the dielectric structure 460 is greater than that of the gate trench 440. Then, as shown in FIG. 5G, the surface region of the semiconductor base 410 is removed by selectively etching to have the dielectric structure 460 protruding the surface of the semiconductor base 410. Meanwhile, the doped region 484 close to the original upper surface of the well 470 is totally removed, but the portion of the source region 482 covered by the dielectric structure 460 is remained after the present etching step. Therefore, as a preferred embodiment, etching depth of the present etching step had better reach the thickness of the dielectric structure 460 to make sure that the source region 482 is exposed.

Figure 5H:
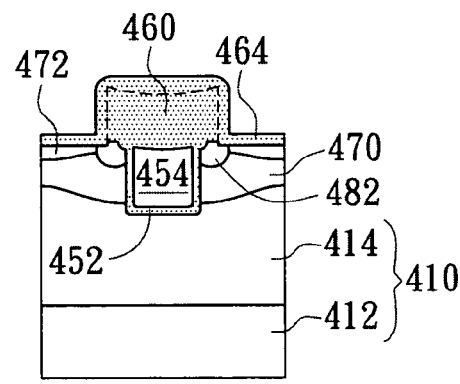
Figure 5I:
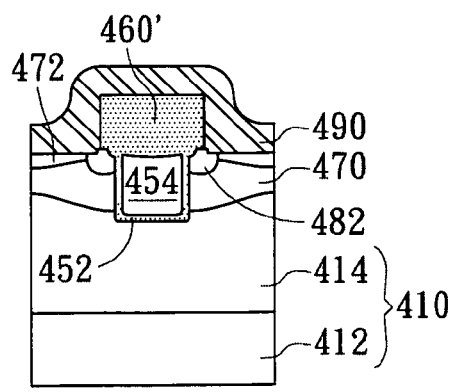

Thereafter, as shown in FIG. 5H, a dielectric layer 464 is deposited over the semiconductor base 410 and extends along the surface profile of the semiconductor base 410 and the dielectric structure 460. It is noted that the portion of the dielectric layer 464 on the sidewall of the dielectric structure 460 can be utilized for shielding the source region 482 therebelow to prevent the conductivity type of the source region 482 from being influenced by the following ion implantation step. Then, the ion implantation step for forming a heavily doped region 472 in the well 470 is carried out by using the dielectric structure 460 and the portion of the dielectric layer 464 on the sidewall of the dielectric structure 460 as a mask. The conductivity type of the heavily doped region 472 is identical to that of the well 470. Thereafter, as shown in FIG. 5I, at least a portion of the dielectric layer 464 is removed by etching to form a dielectric structure 460', which is composed of the original dielectric structure 460 and the remained dielectric layer 464, so that the source region 482 and the heavily doped region 472 are exposed. Finally, a source metal layer 490 is formed over the semiconductor base 410 and the dielectric structure 460' to connect the source region 482 and the heavily doped region 472.

In contrast with the first embodiment, the dielectric structure 460 of the present embodiment is defined in the concave 431 of the semiconductor base 410 and the source region 482 is defined at the bottom of the concave 431 beside the gate trench 440. Thus, the formation of the first dielectric layer 162 and the corresponding etching step described in the first embodiment can be skipped.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trenched MOS device comprising the steps of:
   providing a semiconductor base;
   forming a gate trench in the semiconductor base, the gate trench extending downward from an upper surface of the semiconductor base;
   forming a gate electrode in the gate trench;
   forming a dielectric structure above the gate electrode, the dielectric structure protruding the upper surface of the semiconductor base;
   forming a well in an upper portion of the semiconductor base;
   forming a source region in the well and adjacent to the gate electrode;
   depositing a first dielectric layer over the semiconductor base as a whole;
   forming a heavily doped region in the well by using the dielectric structure and the first dielectric layer lining a sidewall of the dielectric structure with a first dielectric thickness as an ion implantation mask, and the source region being substantially shielded by the first dielectric layer on the sidewall of the dielectric structure;
   removing at least a portion of the first dielectric layer to expose the source region and the heavily doped region, the source region having a width dimension determined by the first dielectric thickness; and
   forming a source metal layer connecting to the source region and the heavily doped region.

2. The fabrication method of claim 1, wherein the step of forming the gate trench in the semiconductor base comprises:
   forming a pattern layer on the upper surface of the semiconductor base;
   forming a first spacer on a sidewall of at least an opening of the pattern layer; and
   etching the semiconductor base through the pattern layer and the first spacer to form the gate trench.

3. The fabrication method of claim 2, wherein the step of forming the source region comprises: forming a first doped region in an upper portion of the well;
   depositing a second dielectric layer over the semiconductor base; and
   removing a portion of the first doped region by using the dielectric structure and the second dielectric layer with respect to the sidewall of the dielectric layer as a mask to form a source region adjacent to the gate trench and expose the well beneath the first doped region; wherein the first dielectric layer is located on the second dielectric layer to shield the source region.

4. The fabrication method of claim 2, after the step of forming the gate trench by etching the semiconductor base through the pattern layer and the first spacer, further comprising:
 forming a second spacer covering at least a sidewall of the gate trench; and
 etching the semiconductor base through the pattern layer, the first spacer, and the second spacer to form a groove beneath the gate trench.

5. The fabrication method of claim 4, before the step of forming the second spacer, further comprising:
 forming a second doped region at a bottom of the gate trench;
 wherein the groove formed beneath the gate trench separating the second doped region into two portions.

6. The fabrication method of claim 5, wherein the step of forming the gate electrode comprises:
 forming a thick dielectric layer in the groove by using the second spacer as a mask;
 removing the second spacer; forming a gate dielectric layer on an inner surface of the gate trench; and
 forming a polysilicon structure in the gate trench.

7. The fabrication method of claim 6, wherein the thick dielectric layer is formed in the groove by wet oxidation.

8. The fabrication method of claim 1, wherein the first dielectric layer is a low temperature oxide (LTO) layer.

9. The fabrication method of claim 1, wherein the dielectric structure is extended into the gate trench.

10. The fabrication method of claim 1, wherein width of the dielectric structure is substantially identical to that of the gate trench.

11. The fabrication method of claim 1, wherein the step of forming the gate trench in the semiconductor base comprises:
 forming a pattern layer on the upper surface of the semiconductor base;
 forming a concave in a surface region of the semiconductor base through the pattern layer;
 forming a first spacer covering at least a sidewall of the concave; and
 etching the semiconductor base through the pattern layer and the first spacer to form the gate trench beneath the concave.

12. The fabrication method of claim 11, wherein the step of forming the dielectric structure comprises:
 filling the concave with a dielectric material to form the dielectric structure in the concave; and
 removing the surface region of the semiconductor base by selectively etching the semiconductor base to have the dielectric structure protruding the semiconductor base; wherein width of the dielectric structure is greater than that of the gate trench.

13. The fabrication method of claim 12, wherein the steps of forming the well and the source region is earlier than the step of forming the dielectric structure but later than the step of forming the gate electrode.

14. The fabrication method of claim 13, wherein the step of forming the source region comprises:
 removing the first spacer; and forming the source region at a bottom of the concave by ion implantation.

15. A fabrication of a trenched MOS device comprising the steps of:
 providing a semiconductor base;
 forming a gate trench in the semiconductor base, the gate trench extending downward from an upper surface of the semiconductor base;
 forming a gate electrode in the gate trench;
 forming a dielectric structure above the gate electrode, the dielectric structure protruding the upper surface of the semiconductor base, and width of the dielectric structure being substantially identical to that of the gate trench;
 forming a well in an upper portion of the semiconductor base;
 forming a first doped region in an upper portion of the well;
 depositing a first dielectric layer on the semiconductor base;
 removing a portion of the first doped region by using the dielectric structure and the first dielectric layer on a sidewall of the dielectric structure with a first dielectric thickness as a mask to leave a source region adjacent to the gate electrode and expose the well beneath the first doped region;
 forming a heavily doped region in the well;
 removing at least a portion of the first dielectric layer to expose the source region and the heavily doped region, the source region havin a width dimension determined by the first dielectric thickness; and
 forming a source metal layer connecting to the source region and the heavily doped region.

16. The fabrication method of claim 15, wherein the step of forming the gate trench in the semiconductor base comprises:
 forming a pattern layer on the upper surface of the semiconductor base;
 forming a first spacer lining a sidewall of at least an opening of the pattern layer; and
 forming the gate trench in the semiconductor base by etching the semiconductor base through the pattern layer and the first spacer.

17. The fabrication method of claim 16, after the step of forming the gate trench in the semiconductor base, further comprising:
 forming a second spacer covering at least a sidewall of the gate trench; and
 etching the semiconductor base through the pattern layer, the first spacer, and the second spacer to form a groove beneath the gate trench.

18. The fabrication method of claim 17, before the step of forming the second spacer, further comprising:
 forming a second doped region at a bottom of the gate trench;
 wherein the second doped region is separated into two portions by the groove beneath the gate trench.

19. The fabrication method of claim 18, wherein the step of forming the gate electrode comprises:
 forming a thick dielectric layer in the groove by using the second spacer as a mask;
 removing the second spacer;
 forming a gate dielectric layer on an inner surface of the gate trench; and
 forming a polysilicon structure in the gate trench.

20. The fabrication method of claim 15, wherein the dielectric structure is extended into the gate trench.

21. The fabrication method of claim 15, wherein the step of forming the heavily doped region comprising:
 depositing a second dielectric layer over the semiconductor base as a whole, wherein the second dielectric layer is located on the first dielectric layer for shielding the source region; and
 forming the heavily doped region in the well by using the dielectric structure and the second dielectric layer corresponding to the sidewall of the dielectric structure as an ion implantation mask.

* * * * *